(12) United States Patent
Matsuoka et al.

(10) Patent No.: US 8,924,825 B2
(45) Date of Patent: Dec. 30, 2014

(54) ERROR DETECTING DEVICE AND MEMORY SYSTEM

(75) Inventors: Teruyuki Matsuoka, Yokohama (JP); Yukio Ishikawa, Yokohama (JP); Tsuyoshi Ukyo, Yokohama (JP); Fuying Yang, Kawasaki (JP); Toshihiko Kitazume, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 13/422,026

(22) Filed: Mar. 16, 2012

(65) Prior Publication Data

US 2013/0067300 A1 Mar. 14, 2013

(30) Foreign Application Priority Data

Sep. 13, 2011 (JP) ................................ 2011-199424

(51) Int. Cl.
*H03M 13/00* (2006.01)
*H03M 13/15* (2006.01)
(52) U.S. Cl.
CPC .............................. *H03M 13/1545* (2013.01)
USPC ........................................ 714/785; 714/781
(58) Field of Classification Search
CPC ................................................. H03M 13/1545
USPC ................ 714/781, 782, 784, 807, 785
See application file for complete search history.

(56) References Cited

U.S. PATENT DOCUMENTS

| | | | |
|---|---|---|---|
| 4,494,234 A | 1/1985 | Patel | |
| 4,642,808 A * | 2/1987 | Baggen | 714/784 |
| 5,428,628 A | 6/1995 | Hassner et al. | |
| 6,061,826 A * | 5/2000 | Thirumoorthy et al. | 714/784 |
| 6,119,262 A | 9/2000 | Chang et al. | |
| 6,192,497 B1 * | 2/2001 | Yang et al. | 714/781 |
| 6,487,692 B1 * | 11/2002 | Morelos-Zaragoza | 714/784 |
| 7,206,993 B2 * | 4/2007 | Senda et al. | 714/784 |
| 7,249,310 B1 * | 7/2007 | Feng et al. | 714/784 |
| 8,201,058 B2 * | 6/2012 | Shrader et al. | 714/781 |
| 8,370,727 B2 * | 2/2013 | Yang | 714/781 |
| 8,392,806 B2 * | 3/2013 | Kim et al. | 714/782 |

FOREIGN PATENT DOCUMENTS

JP 8-130480 5/1996

OTHER PUBLICATIONS

Office Action issued Jan. 24, 2014 in Japanese Patent Application No. 2011-199424 (with English translation).

* cited by examiner

*Primary Examiner* — Cynthia Britt
(74) *Attorney, Agent, or Firm* — Oblon, Spivak, McClelland, Maier & Neustadt, L.L.P.

(57) ABSTRACT

According to one embodiment, an error detecting device includes a syndrome processor, an error locator polynomial generator, and a search processor. The syndrome processor is configured to generate syndrome values based on received data. The error locator polynomial generator is configured to generate coefficients for an error locator polynomial based on the syndrome values. The search processor configured to detect an error location by calculating a root of the error locator polynomial. The search processor has a clock controller, a buffer, a polynomial generator, and a first judging module. The clock controller is configured to output or stop a clock signal according to at least one of the coefficients. The buffer is configured to drive the clock signal outputted form the clock controller. The polynomial generator is configured to calculate a part of the error locator polynomial in synchronization with the clock signal driven by the buffer.

20 Claims, 6 Drawing Sheets

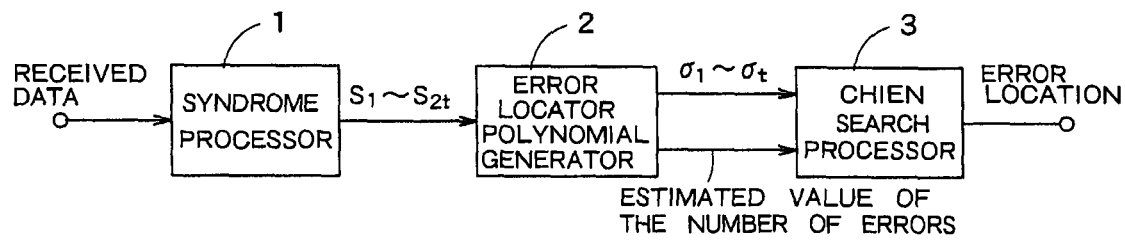
FIG. 1
| SIGMA VALUES | ESTIMATED VALUE OF THE NUMBER OF ERRORS | | | | | | | |
|---|---|---|---|---|---|---|---|---|
| | 0 | 1 | 2 | 3 | 4 | ... | t−1 | t |
| $\sigma_1$ | 0 | NOT 0 | NOT 0 | NOT 0 | NOT 0 | ... | NOT 0 | NOT 0 |
| $\sigma_2$ | 0 | 0 | NOT 0 | NOT 0 | NOT 0 | ... | NOT 0 | NOT 0 |
| $\sigma_3$ | 0 | 0 | 0 | NOT 0 | NOT 0 | ... | NOT 0 | NOT 0 |
| $\sigma_4$ | 0 | 0 | 0 | 0 | NOT 0 | ... | NOT 0 | NOT 0 |
| ... | ... | ... | ... | ... | ... | ... | ... | ... |
| $\sigma_{t-1}$ | 0 | 0 | 0 | 0 | 0 | ... | NOT 0 | NOT 0 |
| $\sigma_t$ | 0 | 0 | 0 | 0 | 0 | ... | 0 | NOT 0 |
FIG. 2
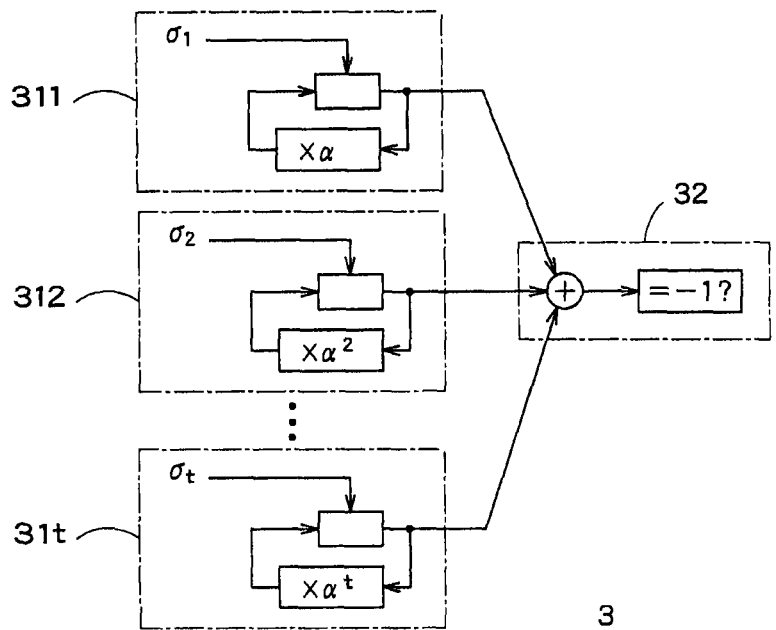
FIG. 3

$\sigma_k \neq 0$ $\sigma_k = 0$

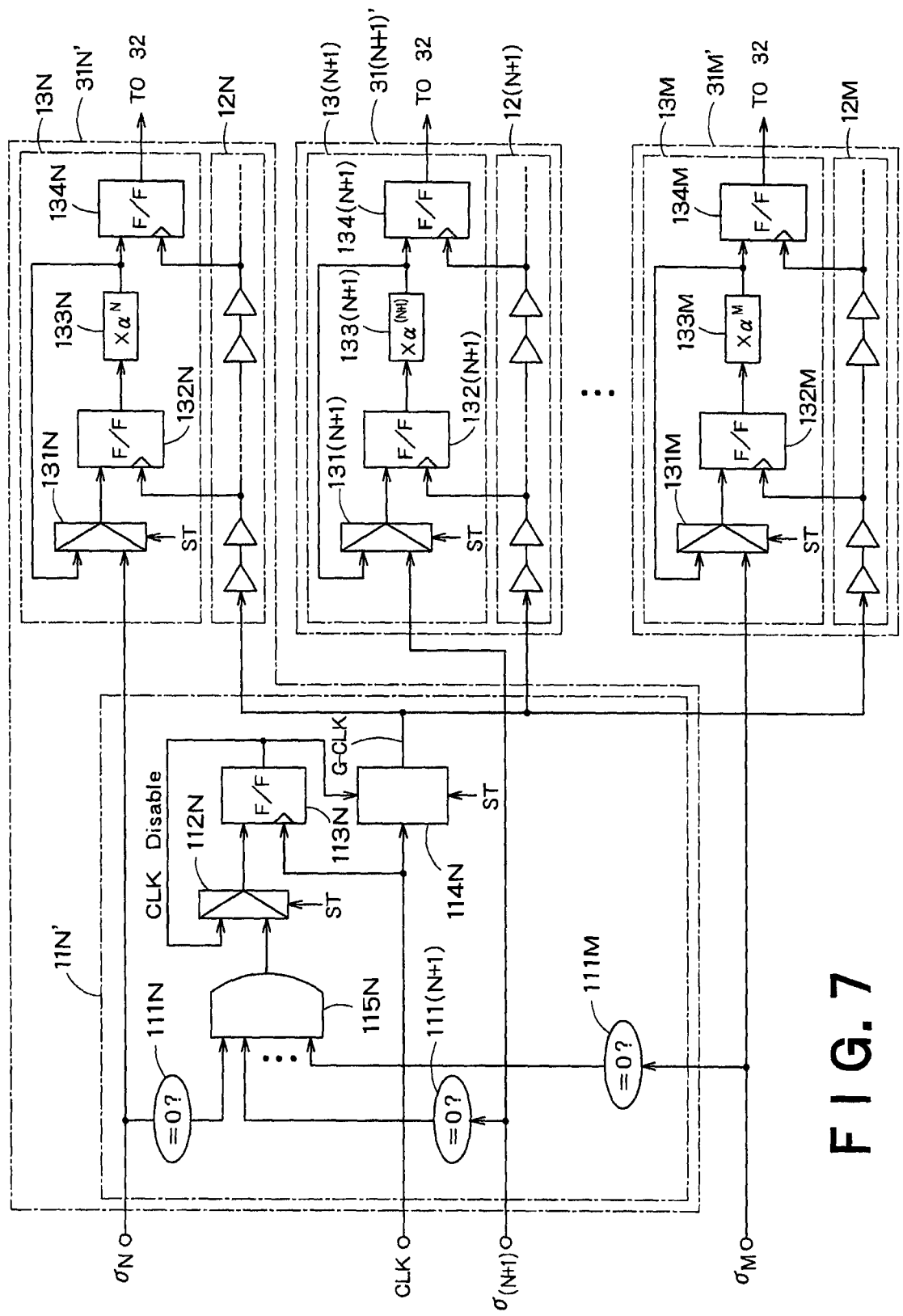
F I G. 7

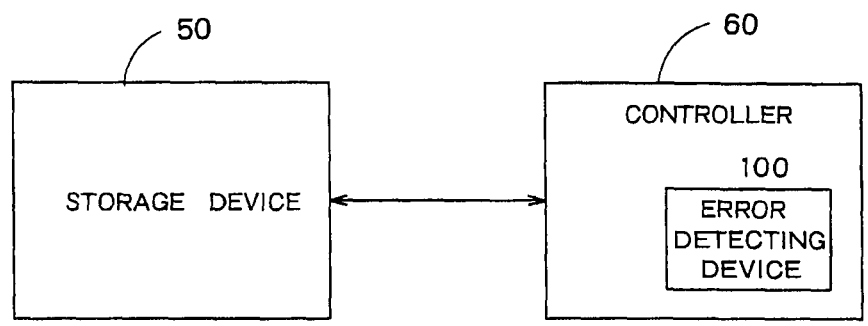
F I G. 9

US 8,924,825 B2

ERROR DETECTING DEVICE AND MEMORY SYSTEM

CROSS REFERENCE TO RELATED APPLICATIONS

This application is based upon and claims the benefit of priority from the prior Japanese Patent Application No. 2011-199424, filed on Sep. 13, 2011, the entire contents of which are incorporated herein by reference.

FIELD

Embodiments described herein relate generally to an error detecting device and a memory system.

BACKGROUND

In a semiconductor storage device such as a flash memory, errors are sometimes included in a read value. Therefore, an error detecting device is often incorporated into the controller of the semiconductor storage device. In recent years, storage capacity of the semiconductor storage device has been considerably increasing, and consumption current of the error detecting device has been correspondingly increasing. Therefore, an error detecting device which operates with low consumption current is required.

BRIEF DESCRIPTION OF THE DRAWINGS

FIG. 1 is a schematic block diagram of an error detecting device 100 according to a first embodiment.

FIG. 2 is a diagram showing the relationship between the estimated values of the number of errors and the sigma values $\sigma_1$ to $\sigma_t$.

FIG. 3 is a diagram showing an example of the internal configuration of the Chien search processor 3.

FIG. 7 is a schematic block diagram of the input modules 31N' to 31M' of the Chien search processor 3 according to the second embodiment.

FIG. 9 is a block diagram showing the schematic configuration of a memory system having the error detecting device.

DETAILED DESCRIPTION

Figure 4:
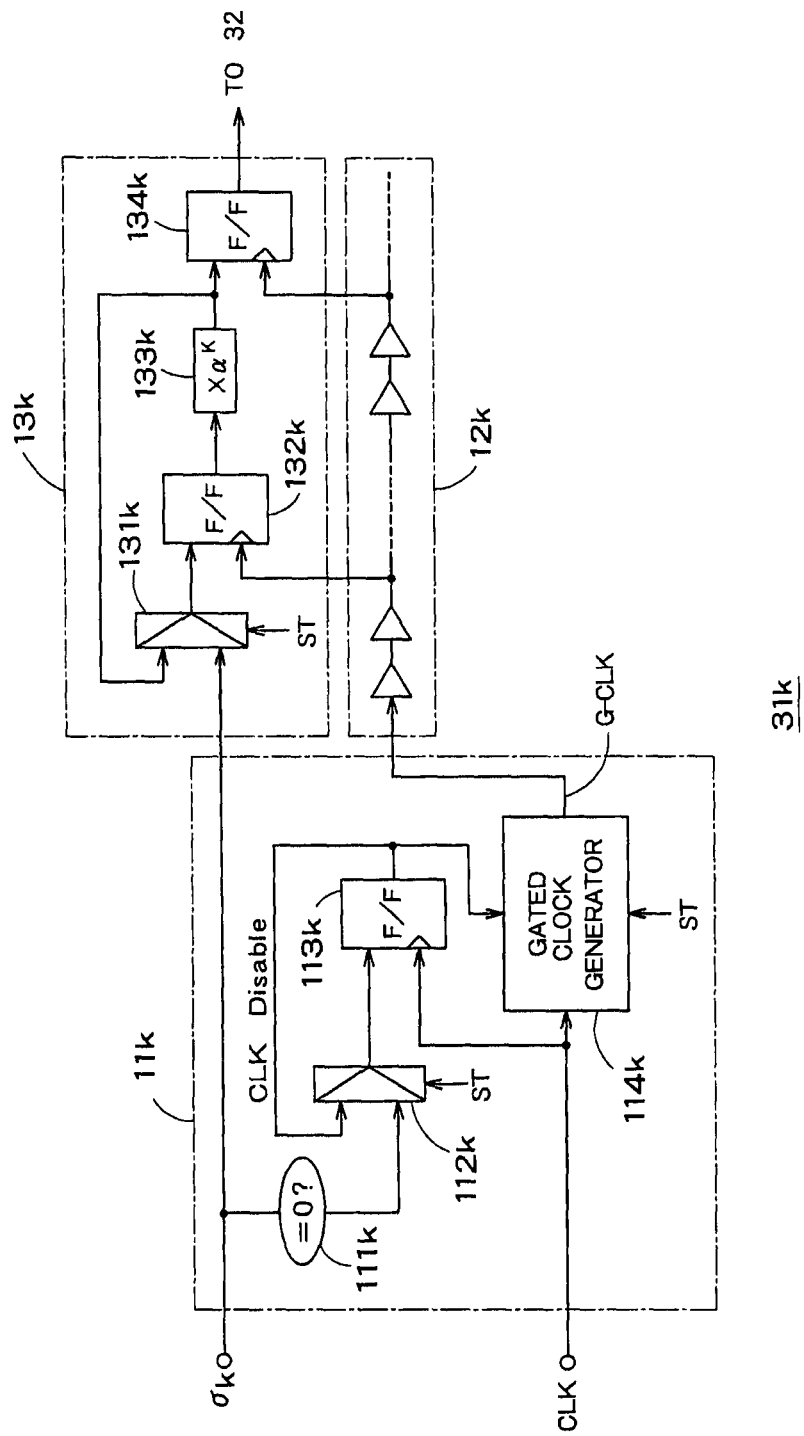
FIG. 4 is a schematic block diagram of the input module 31k of the Chien search processor 3 according to the first embodiment.

In general, according to one embodiment, an error detecting device includes a syndrome processor, an error locator polynomial generator, and a search processor. The syndrome processor is configured to generate syndrome values based on received data. The error locator polynomial generator is configured to generate coefficients for an error locator polynomial based on the syndrome values. The search processor configured to detect an error location by calculating a root of the error locator polynomial. The search processor has a clock controller, a buffer, a polynomial generator, and a first judging module. The clock controller is configured to output or stop a clock signal according to at least one of the coefficients. The buffer is configured to drive the clock signal outputted form the clock controller. The polynomial generator is configured to calculate a part of the error locator polynomial in synchronization with the clock signal driven by the buffer. The first judging module is configured to calculate the root of the error locator polynomial based on the part of the error locator polynomial.

Hereinafter, embodiments will be concretely explained referring to the drawings.

First Embodiment

FIG. 1 is a schematic block diagram of an error detecting device 100 according to a first embodiment. The error detecting device 100 has: a syndrome processor 1; an error locator polynomial generator 2; and a Chien search processor 3. Hereinafter, the maximum number of bits which can be corrected by the error detecting device 100 of FIG. 1 is defined as "t".

The syndrome processor 1 decodes received data including the original data and parity data, and generates "2t" syndrome values $s_1$ to $s_{2t}$. When all of the syndrome values $s_1$ to $s_{2t}$ are zero, there is no error, while when a syndrome value which is not zero is found, the received data includes an error.

The error locator polynomial generator 2 generates an error locator polynomial $\sigma(z)$ by computing sigma values $\sigma_1$ to $\sigma_t$ using the syndrome values $s_1$ to $s_{2t}$, based on Peterson method, Euclidean method, or BM method, for example. The sigma values $\sigma_1$ to $\sigma_t$ are coefficients of the error locator polynomial $\sigma(z)$ expressed in the following Formula (1).

$$\sigma(z) = 1 + \sigma_1 z + \sigma_2 z^2 + \ldots + \sigma_t z^t \qquad (1)$$

$$= 1 + \sum \sigma_k z^k \qquad (1')$$

Further, the error locator polynomial generator 2 can estimate the number of errors in the received data, based on the highest degree of the error locator polynomial $\sigma(z)$. The estimated value of the number of errors is supplied to the Chien search processor 3.

FIG. 2 is a diagram showing the relationship between the estimated values of the number of errors and the sigma values $\sigma_1$ to $\sigma_t$. As shown in FIG. 2, when the estimated value of the number of errors is "k" ("k" is an integer equal to or less than "t"), each of sigma values $\sigma_1$ to $\sigma_k$ becomes a value other than 0, and each of $\sigma_{k+1}$ to $\sigma_t$ becomes 0.

Referring back to FIG. 1, the Chien search processor 3 performs a Chien search process to compute a root of the error locator polynomial $\sigma(z)$ and detect an error location. The Chien search process is a technique in which $\alpha^i$ (i=1 to "t") of powered $\alpha$ is sequentially substituted into the error locator polynomial $\sigma(z)$ to check whether or not error locator polynomial $\sigma(\alpha^i)$ becomes to zero. Since $\alpha^i$ and an error location correspond to each other on a one-to-one basis, an error location can be detected by computing a root of the error locator polynomial $\sigma(z)$. Note that $\alpha$ is a primitive root of Galois field $GF(m^q)$.

FIG. 3 is a diagram showing an example of the internal configuration of the Chien search processor 3. The Chien search processor 3 has: input modules 311 to 31t arranged corresponding to the sigma values $\sigma_1$ to $\sigma_t$ respectively; and a judging module 32. Each input module 31k (k=1 to "t") calculates its corresponding term $\sigma_k \alpha^{ik}$ in the error locator polynomial $\sigma(\alpha^i)$. The judging module 32 adds the terms $\sigma_k \alpha^{ik}$ first, and then generates $\Sigma \sigma_k \alpha^{ik}$, which is namely the second term of the error locator polynomial $\sigma(\alpha^i)$ in the above Formula (1'). Then, if $\Sigma\sigma_k\alpha^{ik}=-1$, the judging module 32 judges $\alpha^i$ to be a root of the error locator polynomial $\sigma(z)$. This is because $\sigma(\alpha^i)=0$ when $\Sigma\sigma_k\alpha^{ik}=-1$, based on the above Formula (1').

In the Chien search process, each input module $31k$ sequentially calculates its corresponding term $\sigma_k\alpha^{ik}$ in the order of i=0, 1, . . . t, and the judging module 32 judges whether or not $\alpha^i$ is a root of the error locator polynomial $\sigma(z)$ on each occasion. When the calculation is sequentially performed until i=received data size and the number of times the root was found is less than the estimated value of the number of errors, it is judged that there are errors beyond correcting capability "t", and the error is treated as uncorrectable.

Hereinafter, the Chien search processor 3, which is one of the characteristic features of the present embodiment, will be explained in detail. Since the input modules 311 to $31t$ have a similar internal configuration, explanation will be given on the input module $31k$.

FIG. 4 is a schematic block diagram of the input module $31k$ of the Chien search processor 3 according to the first embodiment. The input module $31k$ of the Chien search processor 3 has: a clock controller $11k$; a buffer $12k$; and a polynomial generator $13k$.

The clock controller $11k$ stops or outputs a clock signal CLK to supply it to the buffer $12k$ depending on the sigma value $\sigma_k$.

More specifically, the clock controller $11k$ has: a σ-value judging module $111k$; a selector $112k$; a flip-flop $113k$; and a gated clock generator $114k$.

The σ-value judging module $111k$ outputs High when the sigma value $\sigma_k$ is 0, and outputs Low when the sigma value $\sigma_k$ is not 0. The selector $112k$ selects and outputs the output signal of the σ-value judging module $111k$ when a start signal ST is High, and selects and outputs the output signal of the flip-flop $113k$ when the start signal ST is Low. The flip-flop $113k$ holds the output signal of the selector $112k$ in synchronization with the clock signal CLK, and outputs it as a clock stop signal CLK Disable. The gated clock generator $114k$ outputs, as a gated clock signal G-CLK, the clock signal CLK switching periodically at a predetermined cycle when the clock stop signal CLK Disable is Low, and stops the gated clock signal G-CLK when the clock stop signal CLK Disable is High.

Note that the start signal ST and the clock signal CLK are commonly inputted into clock controllers 111 to $11t$ in the input modules 311 to $31t$.

The buffer $12k$ is a CTS (Clock Tree Synthesis) circuit for driving the gated clock signal G-CLK outputted from the clock controller $11k$ so that a plurality of flip-flops in the polynomial generator $13k$ operate in synchronization with each other. Due to the switching of the gated clock signal G-CLK, consumption current flows through the buffer $12k$.

The polynomial generator $13k$ computes a part of the error locator polynomial $\sigma(z)$, in synchronization with the gated clock signal G-CLK driven by the buffer $12k$.

More specifically, the polynomial generator $13k$ has: a selector $131k$; a flip-flop $132k$; a multiplier $133k$; and a flip-flop $134k$. The selector $131k$ selects and outputs the sigma value $\sigma_k$ when the start signal ST is High, and selects and outputs the output signal of the multiplier $133k$ when the start signal ST is Low. The flip-flop $132k$ holds the inputted value, in synchronization with the gated clock signal G-CLK driven by the buffer $12k$. The multiplier $133k$ multiplies the inputted value by $\sigma^k$. The flip-flop $134k$ outputs, to the judging module 32, the output signal of the multiplier $133k$, in synchronization with the gated clock signal G-CLK driven by the buffer $12k$.

Hereinafter, processing operation performed by the Chien search processor 3 will be explained as to the case where the sigma value $\sigma_k$ is not 0 and the case where the sigma value $\sigma_k$ is 0, separately.

Figure 5:
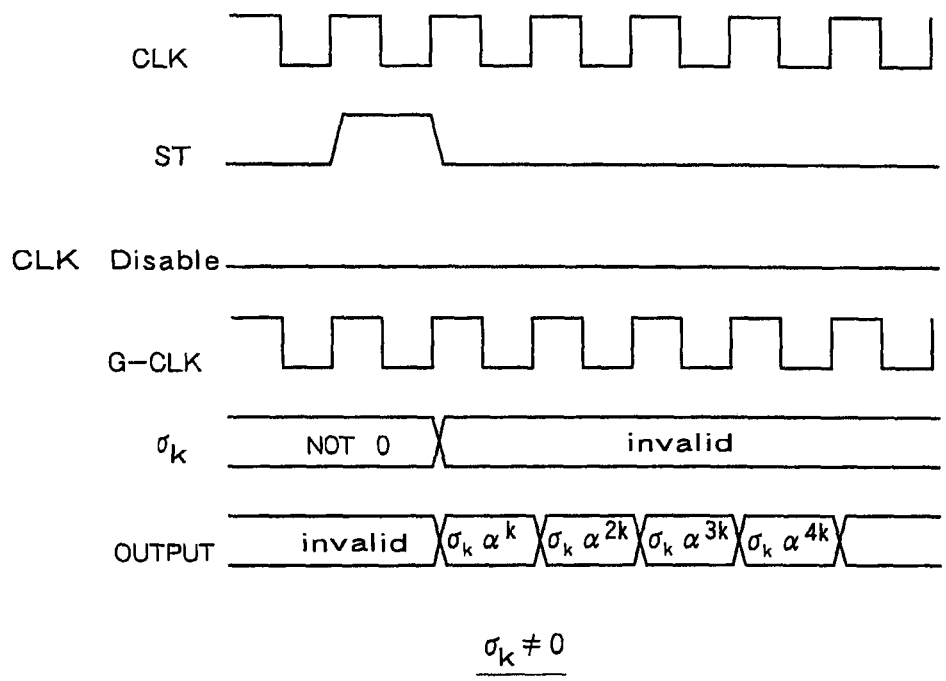
FIG. 5 is a signal waveform of each parts of the input module 31k when the sigma value $\sigma_k$ is not 0.

FIG. 5 is a signal waveform of each parts of the input module $31k$ when the sigma value $\sigma_k$ is not 0. Since the sigma value $\sigma_k$ is not 0, the σ-value judging module $111k$ outputs Low. Accordingly, the clock stop signal CLK Disable is kept Low, and the gated clock generator $114k$ outputs the clock signal CLK as the gated clock signal G-CLK.

This makes the flip-flop $132k$ operate, and the multiplier $133k$ generates $\sigma_k\alpha^k$ first by multiplying $\sigma_k$ by $\alpha^k$. $\sigma_k\alpha^k$ is outputted to the judging module 32 of FIG. 3, and the judging module 32 judges whether or not $\alpha^k$ is a root of the error locator polynomial $\sigma(z)$.

After that, $\sigma_k\alpha^k$ outputted from the multiplier $133k$ is inputted into the multiplier $133k$ through the selector $131k$ and the flip-flop $132k$, and the multiplier $133k$ further multiplies $\sigma^k$ by $\sigma_k\alpha^k$ to generate $\sigma_k\alpha^{2k}$. Then, the judging module 32 judges whether or not $\alpha^{2k}$ is a root of the error locator polynomial $\sigma(z)$. Thereafter, whether or not $\alpha^i$ (i=1 to t) is a root of the error locator polynomial $\sigma(z)$ is sequentially judged in a similar way. As stated above, $\alpha^i$ and an error location correspond to each other on a one-to-one basis, and thus an error location can be detected from a root of the error locator polynomial $\sigma(z)$.

Next, processing operation performed by the input module $31k$ when the sigma value $\sigma_k$ is 0 will be explained. When the sigma value $\sigma_k$ is 0, the polynomial generator $13k$ should continuously output 0. However, if the clock controller $11k$ is not arranged in the input module $31k$, the switching gated clock signal G-CLK is inputted into the buffer $12k$ similarly to FIG. 5, even when the sigma value $\sigma_k$ is 0, which allows useless consumption current to flow through the buffer $12k$.

In view of this problem, the input module $31k$ of the present embodiment performs the following operation to reduce useless consumption current.

Figure 6:
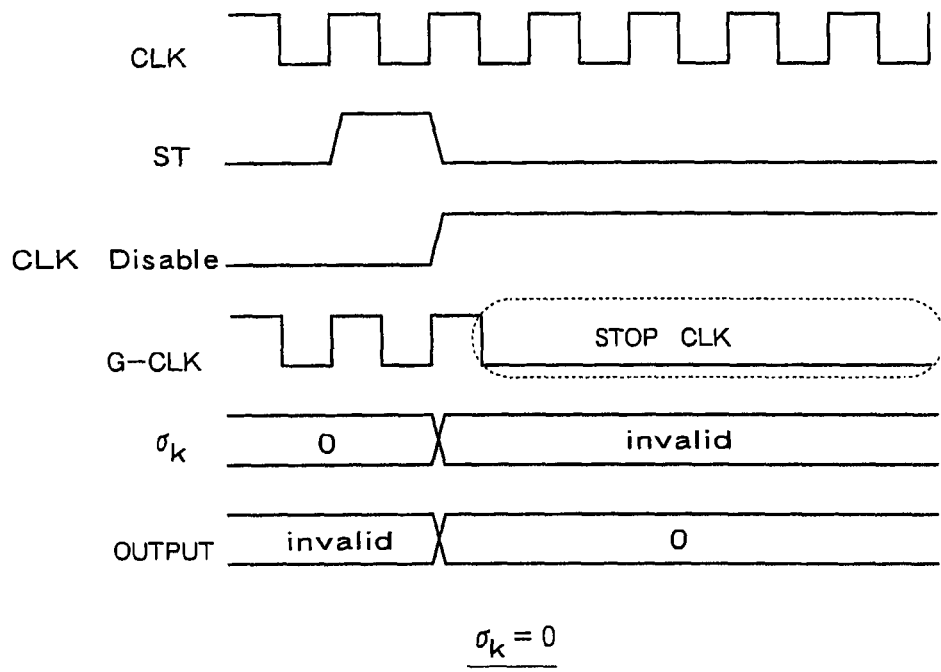
FIG. 6 is a signal waveform of each component of the input module 31k when the sigma value $\sigma_k$ is 0.

FIG. 6 is a signal waveform of each component of the input module $31k$ when the sigma value $\sigma_k$ is 0. Since the sigma value $\sigma_k$ is 0, the σ-value judging module $111k$ outputs High. When the start signal ST becomes High, the selector $112k$ outputs, to the flip-flop $113k$, High outputted from the σ-value judging module $111k$. Next, when the clock signal CLK rises up, the flip-flop $113k$ sets the clock stop signal CLK Disable to High. After that, the gated clock signal G-CLK stops.

As a result, the gated clock signal G-CLK stops switching, thereby reducing consumption current of the buffer $12k$.

As stated above, in the first embodiment, the clock controller $11k$ is arranged, and when the sigma value $\sigma_k$ is not 0, the clock controller $11k$ supplies the clock signal to the buffer $12k$ to judge the root of the error locator polynomial $\sigma(z)$, while when the sigma value σk is 0, the clock controller $11k$ stops supplying the gated clock signal G-CLK to the buffer $12k$. Therefore, consumption current flowing through the buffer $12k$ can be reduced.

Second Embodiment

In the above first embodiment, one clock controller $11k$ is arranged for one input module $31k$. On the other hand, in a second embodiment to be explained hereinafter, one clock controller is arranged for a plurality of input modules.

In the present embodiment, the sigma values $\sigma_1$ to $\sigma_t$ are divided into some coefficient groups each including a plurality of sigma values. For example, each coefficient group includes four sigma values such as $\sigma_1$ to $\sigma_4$, $\sigma_5$ to $\sigma_8$, etc. Then, one clock controller is arranged per one coefficient group. Hereinafter, explanation will be given on input modules 31N' to 31M' corresponding to a coefficient group including sigma values $\sigma_N$ to $\sigma_M$ (N<M≤t).

FIG. 7 is a schematic block diagram of the input modules 31N' to 31M' of the Chien search processor 3 according to the second embodiment. In FIG. 7, the same or similar symbols are assigned to the components in common with FIG. 4, and differences therebetween will be mainly explained hereinafter. Further, in FIG. 7, a clock controller 11N' is arranged in the input module 31N' for convenience.

The clock controller 11N' has: σ-value judging modules 111N to 111M; an AND circuit 115N; a selector 112N; a flip-flop 113N; and a gated clock generator 114N. The AND circuit 115N outputs the logical product of the output signals from the σ-value judging modules 111N to 111M. That is, the AND circuit 115N outputs High when all of the sigma values $\sigma_N$ to $\sigma_M$ are 0, and outputs Low when at least one of them is not 0. The other aspects of the operation are similar to FIG. 4.

When all of the sigma values $\sigma_N$ to $\sigma_M$ are 0, each of polynomial generators 13N to 13M should continuously output 0. Therefore, the clock controller 11N' stops the gated clock signal G-CLK supplied to buffers 12N to 12M, thereby reducing consumption current.

On the other hand, when at least one of the sigma values $\sigma_N$ to $\sigma_M$ is not 0, the polynomial generators 13N to 13M operate and the judging module 32 judges the root of the error locator polynomial σ(z). For example, when the sigma values $\sigma_N$ to $\sigma_{M-1}$ are not 0 and $\sigma_M$ is 0, useless consumption current may flow through the buffer 12M which should continuously output 0, the buffer 12M corresponding to the sigma value $\sigma_M$, which is different from the first embodiment where the clock controller 11k is arranged for each sigma value $\sigma_k$. However, the area size of the error detecting device can be reduced.

Note that the number of sigma values included in each coefficient group may be arbitrarily determined. For example, when a larger number of sigma values are included in each coefficient group, the area size of the error detecting device can be further reduced.

As stated above, in the second embodiment, one clock controller is arranged for a plurality of sigma values. Therefore, consumption current can be reduced with the error detecting device 100 having a smaller size.

Third Embodiment

In the above first and second embodiments, the gated clock signal G-CLK inputted into the buffer 12k is controlled based on whether or not each sigma value $\sigma_k$ is 0. On the other hand, in a third embodiment to be explained hereinafter, the gated clock signal G-CLK is controlled based on the estimated value of the number of errors.

In the present embodiment, the sigma values $\sigma_1$ to $\sigma_t$ are divided into some coefficient groups each including a plurality of sigma values similarly to the second embodiment, in order to reduce the consumption current of an error detecting device 100 in view of the relationship of FIG. 2.

Figure 8:
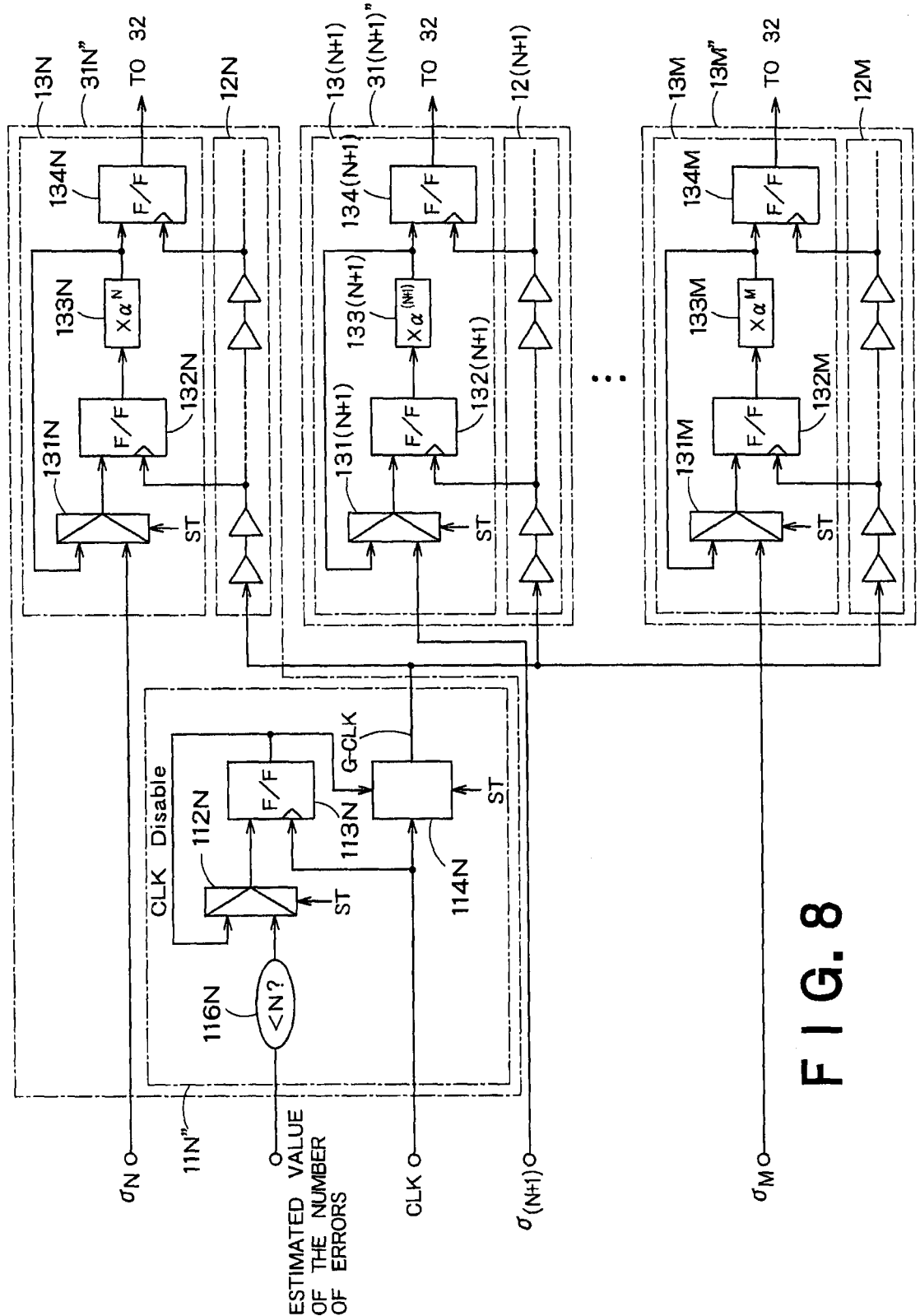
FIG. 8 is a schematic block diagram of the input modules 31N" to 31M" of the Chien search processor 3 according to the third embodiment.

FIG. 8 is a schematic block diagram of the input modules 31N" to 31M" of the Chien search processor 3 according to the third embodiment. Hereinafter, differences from FIG. 7 will be mainly explained.

A clock controller 11N" has an estimated value judging module 116N instead of the σ-value judging module. The estimated value judging module 116N outputs High when the estimated value of the number of errors is less than N, and outputs Low when the estimated value is N or greater.

When the estimated value of the number of errors is less than N, each of the sigma values $\sigma_N$ to $\sigma_M$ becomes 0, as shown in FIG. 2. Therefore, consumption current can be reduced by stopping the gated clock signal G-CLK, similarly to the second embodiment.

On the other hand, when the estimated value of the number of errors is N or greater, at least one of the sigma values $\sigma_N$ to $\sigma_M$ is not 0, as shown in FIG. 2. Therefore, the switching gated clock signal G-CLK is generated to compute the root of the error locator polynomial, similarly to the second embodiment.

As stated above, in the third embodiment, the gated clock signal G-CLK is controlled depending on the estimated value of the number of errors. Therefore, consumption current flowing through the buffer 12k can be reduced.

The error detecting device 100 explained in each embodiment can be used in a memory system, for example. FIG. 9 is a block diagram showing the schematic configuration of a memory system having the error detecting device. The memory system has a storage device 50 and a controller 60 therefor. The storage device 50 is a semiconductor storage device such as an NAND-type flash memory, for example. The controller 60 controls writing into and reading from the storage device 50. Further, the controller 60 has the above error detecting device, and detects an error in the value read from the storage device 50.

Even when the storage capacity of the storage device 50 is large, the error detecting device can detect errors with low power consumption.

In addition, the error detecting device can be used in a communication system etc.

While certain embodiments have been described, these embodiments have been presented by way of example only, and are not intended to limit the scope of the Inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. An error detecting device comprising:
   a syndrome processor configured to generate syndrome values based on received data;
   an error locator polynomial generator configured to generate coefficients for an error locator polynomial based on the syndrome values; and
   a search processor configured to detect an error location by calculating a root of the error locator polynomial, the search processor including:
      a clock controller configured to output or stop a clock signal according to at least one of the coefficients;
      a buffer configured to drive the clock signal outputted form the clock controller;
      a polynomial generator configured to calculate a part of the error locator polynomial in synchronization with the clock signal driven by the buffer; and
      a first judging module configured to calculate the root of the error locator polynomial based on the part of the error locator polynomial.

2. The device of claim 1, wherein
   the clock controller is provided corresponding to each of the coefficients, and the clock controller is further configured to stop the clock signal when the corresponding coefficient is 0, and output the clock signal when the corresponding coefficient is not 0.

3. The device of claim 2, wherein the clock controller comprises:
a second judging module configured to judge whether to output or stop the clock signal according to the corresponding coefficient; and
a gated clock generator configured to output the clock signal or stop the clock signal depending on a judgment result.

4. The device of claim 3, wherein
the clock controller further comprises a flip-flop configured to generate a clock stop signal depending on the judgment result of the second judging module at starting processing of an error location detection, and then, hold the clock signal stop signal, and
the gated clock generator is configured to output or stop the clock signal depending on an output of the clock stop signal by the flip-flop.

5. The device of claim 1, wherein
the clock controller is provided corresponding to a coefficient group comprising a plurality of coefficients among the coefficients, and
the clock controller is further configured to stop the clock signal when all of the coefficients in the coefficient group are 0.

6. The device of claim 5, wherein the clock controller comprises:
a plurality of third judging modules, each being provided corresponding to each of the plurality of coefficients, and each configured to judge whether a corresponding coefficient among the coefficients is 0; and
a logic circuit configured to judge whether all of the coefficients in the coefficient group are 0 based on judgment results of the third judging modules.

7. The device of claim 6, wherein the clock controller further comprises a gated clock generator configured to output or stop the clock signal depending on the judgment result of the logic circuit.

8. The device of claim 7, wherein
the clock controller further comprises a flip-flop configured to generate a clock stop signal depending on the judgment result of the logic circuit at starting processing of an error location detection, and then, hold the clock signal stop signal, and
the gated clock generator is configured to output or stop the clock signal depending on an output of the clock stop signal by the flip-flop.

9. An error detecting device comprising:
a syndrome processor configured to generate syndrome values based on received data;
an error locator polynomial generator configured to generate coefficients for an error locator polynomial based on the syndrome values, and estimate the number of errors in the received data; and
a search processor configured to detect an error location by calculating a root of the error locator polynomial, the search processor including:
a clock controller configured to output or stop a clock signal according to the estimated number of errors;
a buffer configured to drive the clock signal outputted form the clock controller;
a polynomial generator configured to calculate a part of the error locator polynomial in synchronization with the clock signal driven by the buffer; and
a first judging module configured to calculate the root of the error locator polynomial based on the part of the error locator polynomial.

10. The device of claim 9, wherein
the error locator polynomial generator is further configured to generate "t" coefficients,
the clock controller is provided corresponding to a coefficient group comprising N-th to M-th coefficients ("N" and "M" are arbitrary positive integers satisfying N, M≤t) among the coefficients, and
the clock controller is further configured to stop the clock signal when the estimated number of errors is less than "N".

11. The device of claim 9, wherein the clock controller comprises:
a fourth judging module configured to judge whether the estimated number of errors is less than "N"; and
a gated clock generator configured to output or stop the clock signal depending on a judgment result.

12. The device of claim 11, wherein
the clock controller further comprises a flip-flop configured to generate a clock stop signal depending on the judgment result of the fourth judging module at starting processing of an error location detection, and then, hold the clock signal stop signal, and
the gated clock generator is configured to output or stop the clock signal depending on an output of the clock stop signal by the flip-flop.

13. A memory system comprising:
a storage device; and
a controller configured to read data from the storage device, the controller comprising an error detector, the error detector including:
a syndrome processor configured to generate syndrome values based on the read data;
an error locator polynomial generator configured to generate coefficients for an error locator polynomial based on the syndrome values; and
a search processor configured to detect an error location by calculating a root of the error locator polynomial, and
the search processor includes:
a clock controller configured to output or stop a clock signal according to at least one of the coefficients;
a buffer configured to drive the clock signal outputted form the clock controller;
a polynomial generator configured to calculate a part of the error locator polynomial in synchronization with the clock signal driven by the buffer; and
a first judging module configured to calculate the root of the error locator polynomial based on the part of the error locator polynomial.

14. The system of claim 13, wherein
the clock controller is provided corresponding to each of the coefficients, and
the clock controller is further configured to stop the clock signal when the corresponding coefficient is 0, and output the clock signal when the corresponding coefficient is not 0.

15. The system of claim 14, wherein the clock controller comprises:
a second judging module configured to judge whether to output or stop the clock signal according to the corresponding coefficient; and
a gated clock generator configured to output the clock signal or stop the clock signal depending on a judgment result.

16. The system of claim 15, wherein
the clock controller further comprises a flip-flop configured to generate a clock stop signal depending on the judgment result of the second judging module at starting processing of an error location detection, and then, hold the clock signal stop signal, and
the gated clock generator is configured to output or stop the clock signal depending on an output of the clock stop signal by the flip-flop.

17. The system of claim 13, wherein
the clock controller is provided corresponding to a coefficient group comprising a plurality of coefficients among the coefficients, and
the clock controller is further configured to stop the clock signal when all of the coefficients in the coefficient group are 0.

18. The system of claim 17, wherein the clock controller comprises:
a plurality of third judging modules, each being provided corresponding to each of the plurality of coefficients, and each configured to judge whether a corresponding coefficient among the coefficients is 0; and
a logic circuit configured to judge whether all of the coefficients in the coefficient group are 0 based on judgment results of the third judging modules.

19. The system of claim 18, wherein the clock controller further comprises a gated clock generator configured to output or stop the clock signal depending on a judgment result of the logic circuit.

20. The system of claim 19, wherein
the clock controller further comprises a flip-flop configured to generate a clock stop signal depending on the judgment result of the logic circuit at starting processing of an error location detection, and then, hold the clock signal stop signal; and
the gated clock generator is configured to output or stop the clock signal depending on an output of the clock stop signal by the flip-flop.

* * * * *